(12) United States Patent
Shimamura

(10) Patent No.: US 6,671,656 B2
(45) Date of Patent: Dec. 30, 2003

(54) STRUCTURE ANALYSIS METHOD AND PROGRAM, AND RECORDING MEDIUM THEREOF

(75) Inventor: Kouichi Shimamura, Nagano (JP)

(73) Assignee: Fujitsu Nagano Systems Engineering Limited, Nagano (JP)

( * ) Notice: Subject to any disclaimer, the term of this patent is extended or adjusted under 35 U.S.C. 154(b) by 22 days.

(21) Appl. No.: 10/106,822

(22) Filed: Mar. 27, 2002

(65) Prior Publication Data

US 2002/0173939 A1 Nov. 21, 2002

(30) Foreign Application Priority Data

Mar. 27, 2001 (JP) ........................................ 2001-089757

(51) Int. Cl.[7] .............................................. G06F 15/00
(52) U.S. Cl. ......................... 702/183; 73/146; 345/424; 382/232
(58) Field of Search ........................... 702/23, 42, 138, 702/182, 183; 73/37.5, 146, 574; 703/1–2; 382/203, 232; 345/419, 424, 653; 700/85, 128, 164, 245

(56) References Cited

U.S. PATENT DOCUMENTS

| | | | |
|---|---|---|---|
| 5,548,694 A | * | 8/1996 | Frisken Gibson ........... 345/424 |
| 5,786,533 A | * | 7/1998 | Newman ...................... 73/146 |
| 5,937,094 A | * | 8/1999 | Nagasawa ................... 382/232 |

\* cited by examiner

*Primary Examiner*—John Barlow
*Assistant Examiner*—John Le
(74) *Attorney, Agent, or Firm*—Staas & Halsey LLP

(57) ABSTRACT

In a structure analysis problem for applying a pressure to a curved surface of a structure, the pressure is applied to an area approximated by a VOXEL method, so that the pressure acts on an area different from an area to which the pressure is to be intrinsically applied. In the present invention, to absorb an error of this area, the pressure to be applied is corrected in accordance with the error of the area. Also, the pressure to be applied is recorrected for an error between a correct reaction force A to a load and a total of reaction forces B at points of fulcrum calculated in a structure analysis computation and the structure analysis is performed again. If the error is within a range of tolerance, a stress and a displacement calculated by the structure analysis computation are made a last analysis result.

9 Claims, 5 Drawing Sheets

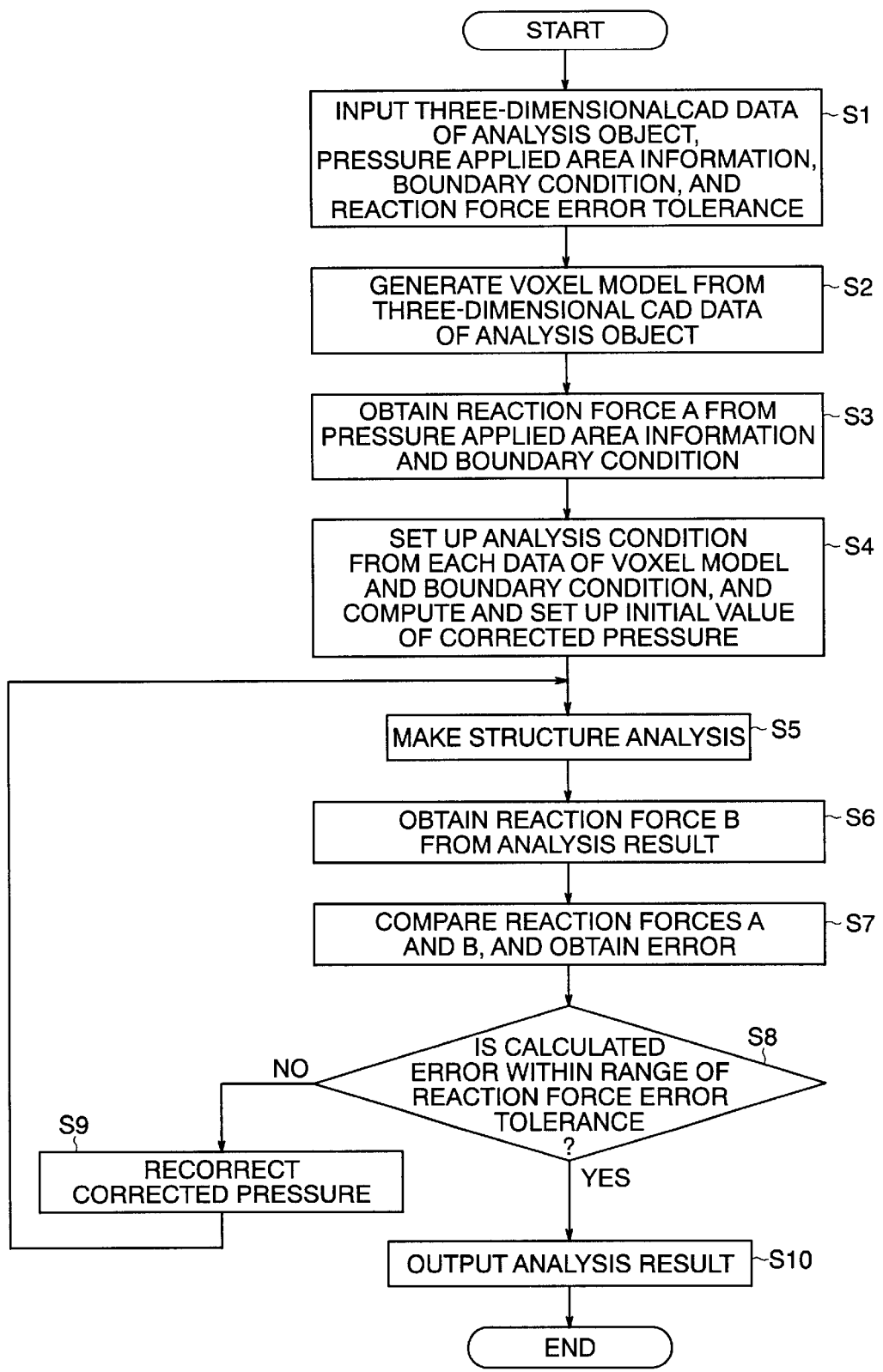

STRUCTURE ANALYSIS METHOD AND PROGRAM, AND RECORDING MEDIUM THEREOF

BACKGROUND OF THE INVENTION

1. Field of the Invention

The present invention relates to a structure analysis processing method and program and a recording medium thereof, and more particularly to a structure analysis processing method and program and a recording medium which are employed in the structure analysis by a computer for computing the displacement and the stress by applying a pressure to a structure of various shapes, in which there is a minimum error produced by the computation method relying on the conventional VOXEL method.

2. Description of the Related Art

Conventionally, in the structure analysis problem for computing the displacement and the stress by applying a pressure to the curved surface of a structure, the structure was approximated by an aggregate of small rectangular parallelepipeds, each called a VOXEL, to calculate the displacement and the stress for its approximate model using the VOXEL method (finite element method, iteration method).

In the computation method relying on the VOXEL method, to attain the calculation precision, it was necessary to reduce an approximation error by making each size of VOXEL as small as possible.

In the structure analysis for computing the displacement and the stress by applying a pressure to the curved surface of the structure, the computation method relying on the VOXEL method involves making the computation by applying a pressure to the area (of indented surface) approximated by a stepped surface that is different from the area of the structure itself. Therefore, there is an error in the calculated displacement or stress, resulting in the analysis with poor precision to compute the untrue value.

If the VOXEL size is reduced more than needed to increase the analysis precision, there is a problem that the analysis process is inoperable because of insufficient machine resources such as the CPU time or memory, and the desired result cannot be obtained, whereby the minimum of VOXEL size was limited.

If the analysis precision was tried to increase within a range of usable machine resources, it was required that a full-time analysis engineer being well aware of the analysis method managed how to give the boundary conditions, and tried the analysis process under the changed conditions many times.

SUMMARY OF THE INVENTION

It is an object of the present invention to solve the above-mentioned problems intrinsic to the VOXEL method, and to provide a structure analysis processing method in which the reliability of analysis result is assured as an entire model by increasing the analysis precision in a VOXEL size analyzable with the machine resources actually employed in an analysis process, which is automated to enable the persons other than the analysis engineers to make the analysis with high precision.

Also, it is another object of the present invention to provide a structure analysis processing program that implements the structure analysis processing method.

Further, it is another object of the present invention to provide a recording medium that records the structure analysis processing program for implementing the structure analysis processing method.

A structure analysis processing method of the present invention for making the structure analysis of a modeled analysis object to which a pressure is applied, using the VOXEL method. The method comprises calculating a pressure $V_p$ to be applied to a VOXEL model for the analysis object in accordance with an expression $$V_p = F_p \times C_s / V_s$$

where the pressure applied on the analysis object is $F_p$, an actual area of the analysis object to apply the pressure is $C_s$, and the area in the VOXEL model corresponding to the actual area for applying the pressure is $V_s$, and making the structure analysis using the VOXEL method with the calculated pressure $V_p$ as the pressure applied to the VOXEL model.

Also, the structure analysis processing program of the present invention is executed on the computer to implement the structure analysis processing method.

Further, the structure analysis processing program recording medium of the present invention is a computer readable recording medium for recording the structure analysis processing program.

Also, another structure analysis processing method of the present invention for making the structure analysis of a modeled analysis object to which a pressure is applied, using the VOXEL method. The method comprises calculating a pressure to be applied to a VOXEL model of the analysis object, calculating a structure analysis value of interest and a reaction force at a point of fulcrum by the structure analysis computation using the VOXEL method, calculating a corrected pressure which corrects the pressure to be applied to the VOXEL model for an error between a theoretically correct reaction force corresponding to a load on the analysis object and a total of the calculated reaction forces at the points of fulcrum, and performing the structure analysis computation again, using the VOXEL method, based on the corrected pressure.

Also, another structure analysis processing program of the present invention is executed on the computer to implement the structure analysis processing method.

Further, another structure analysis processing program recording medium of the present invention is a computer readable recording medium for recording the structure analysis processing program.

Further, another structure analysis processing method of the present invention for making the structure analysis of a modeled analysis object to which a pressure is applied, using the VOXEL method. The method comprises calculating a pressure $V_p$ to be applied to a VOXEL model for the analysis object in accordance with an expression $$V_p = F_p \times C_s / V_s$$

where the pressure $V_p$ is as an initial value of the pressure to be applied in the structure analysis computation, the pressure applied on the analysis object is $F_p$, an actual area of the analysis object to apply the pressure is $C_s$, and the area in the VOXEL model corresponding to the actual area for applying the pressure is $V_s$, calculating a structure analysis value of interest and a reaction force at a point of fulcrum by the structure analysis computation using the VOXEL method, calculating a corrected pressure which corrects the pressure to be applied to the VOXEL model for an error between a theoretically correct reaction force corresponding to a load on the analysis object and a total of the calculated reaction forces at the points of fulcrum, and performing the structure analysis computation again, using the VOXEL method, based on the corrected pressure.

Also, another structure analysis processing program of the present invention is executed on the computer to implement the structure analysis processing method.

Further, another structure analysis processing program recording medium of the present invention is a computer readable recording medium for recording the structure analysis processing program.

BRIEF DESCRIPTION OF THE DRAWINGS

FIG. 7 is a flowchart showing a process of the structure analysis processing unit.

DETAILED DESCRIPTION OF THE PREFERRED EMBODIMENTS

The present invention has a feature in the structure analysis computation when a pressure is applied to a specified area, noting the relation between pressure and area, that the computation precision is increased by correcting the pressure that can be simply corrected, rather than correcting the area by a step approximation, to solve the above-mentioned problems.

Specifically, the following processings are performed. The three-dimensional CAD data of an analysis object, the boundary conditions and a reaction force error tolerance are input into an apparatus for structure analysis processing. A VOXEL model that is divided into VOXELs is generated from the three-dimensional CAD data of the analysis object, and a reaction force (reaction force A) at a point of fulcrum on the three-dimensional CAD is simply calculated from the pressure applied area information and the boundary conditions on the three-dimensional CAD. This reaction force A is a product of the pressure applied area and the applied pressure on the three-dimensional CAD, and is equal to a load. Then, the analysis conditions are set up from each data of the VOXEL model, the pressure applied area information and the boundary conditions. An initial value of the corrected pressure in which the pressure on the VOXEL model is corrected for an area error is obtained, and is set for the analysis conditions. At this time, the initial value of the corrected pressure is calculated on the basis of the fact that the pressure and the area are inversely prounital under the constant load. Herein, the structure analysis is performed by the finite element method and the iteration method in the VOXEL model to obtain a stress and an amount of deformation (displacement) that are aimed for the structure analysis, and acquire a reaction force (reaction force B) on the VOXEL model. Thereafter, an error between the theoretically correct reaction force A obtained from the three-dimensional CAD data and the reaction force B containing a computational error obtained from the structure analysis of the VOXEL model is obtained, and it is checked whether or not the error falls within a range of reaction force error tolerance. If the error is outside the range of tolerance, the corrected pressure is corrected repeatedly until it falls within the range of tolerance, and the structure analysis is performed again, using the recorrected pressure. The final structure analysis result is the displacement and the stress when the error between the reaction forces A and B falls within the range of tolerance, whereby the structure analysis can be attained at high precision.

The above processing can be realized by a computer and a software program, in which the program can be stored in a suitable recording medium such as a computer readable portable medium memory, a semiconductor memory or a hard disk.

Figure 1:
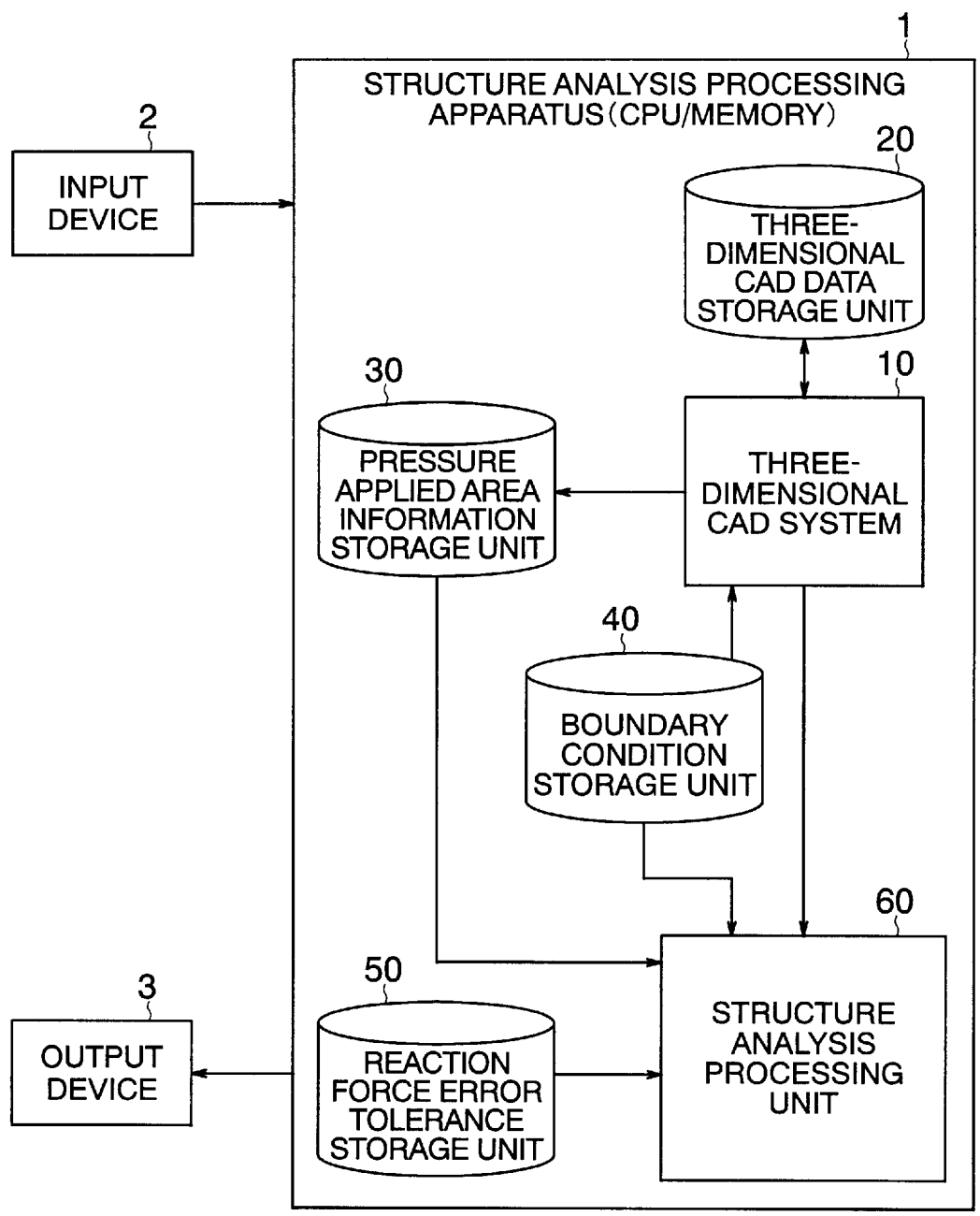
FIG. 1 is a diagram showing a configuration example of a system that realizes the present invention.

The preferred embodiments of the present invention will be described below with reference to the accompanying drawings. FIG. 1 is a diagram showing a configuration example of a system for realizing the invention.

A structure analysis processing apparatus 1 is a computer composed of a CPU and a memory, and comprises a three-dimensional CAD system 10 composed of software programs, a three-dimensional CAD data storage unit 20, a pressure applied area information storage unit 30, a boundary condition storage unit 40, a reaction force error tolerance storage unit 50, and a structure analysis processing unit 60. The structure analysis processing apparatus 1 has an input device 2 and an output device 3 connected thereto.

The structure analysis processing apparatus 1 inputs the analysis object data from the input device 2, and the three-dimensional CAD system 10 stores the analysis object data as the three-dimensional CAD data in the three-dimensional CAD data storage unit 20. Furthermore, the structure analysis processing apparatus 1 inputs the boundary conditions such as a load and a constraint condition and the reaction force error tolerance from the input device 2, which are then stored in the boundary condition storage unit 40 and the reaction force error tolerance storage unit 50, respectively. And the three-dimensional CAD system 10 inputs the three-dimensional CAD data of analysis object from the three-dimensional CAD data storage unit 20, which is then passed to the structure analysis processing unit 60. Also, the pressure applied area is computed from the boundary conditions stored in the boundary condition storage unit 40, and the result (pressure applied area information) is stored in the pressure applied area information storage unit 30.

The structure analysis processing unit 60 makes the structure analysis by inputting the three-dimensional CAD data of analysis object from the three-dimensional CAD system 10, the pressure applied area information from the pressure applied area information storage unit 30, the boundary conditions from the boundary condition storage unit 40, and the reaction force error tolerance from the reaction force error tolerance storage unit 50, and outputs the result to the output device 3.

Figure 2:
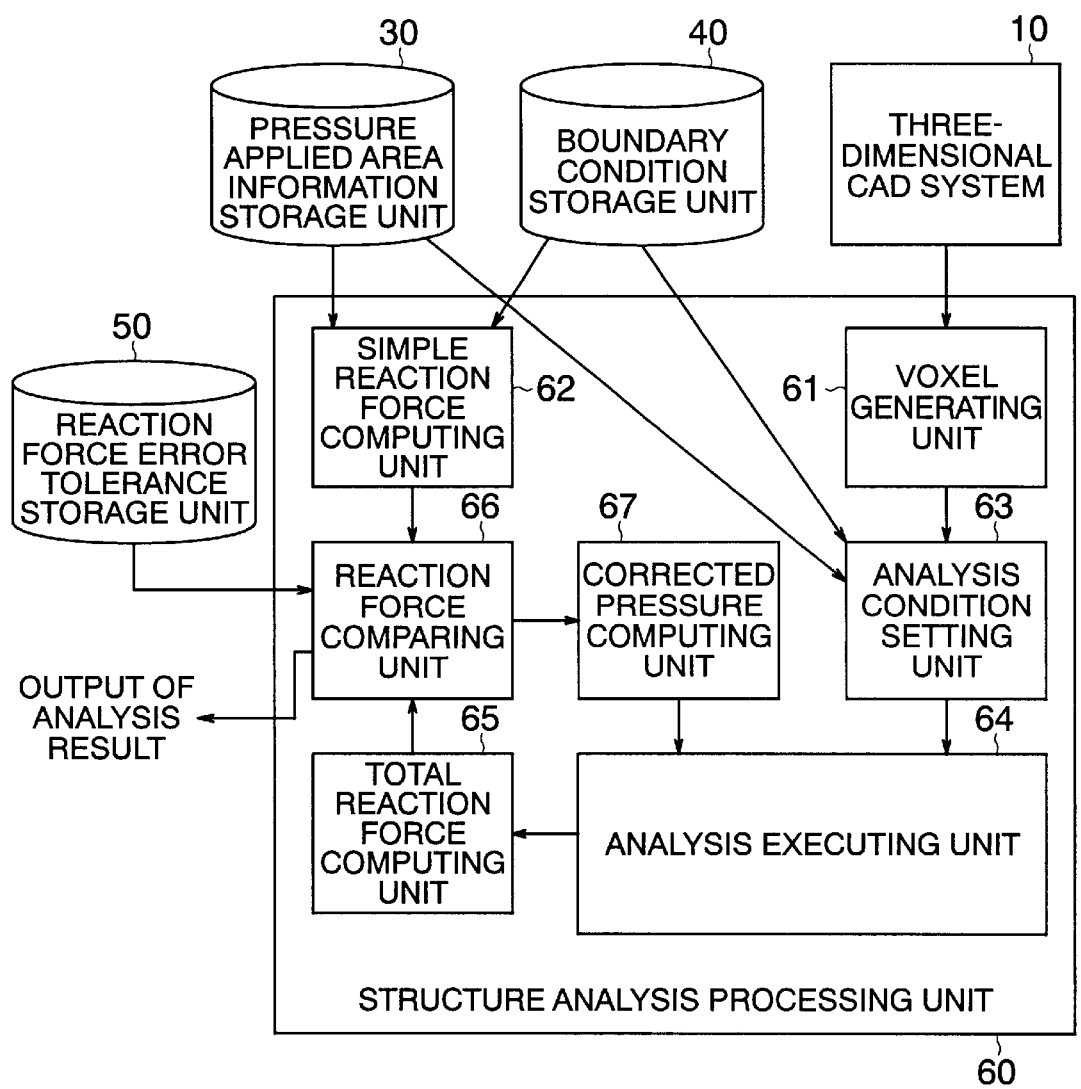
FIG. 2 is a diagram showing a configuration example of a structure analysis processing unit.

FIG. 2 is a diagram showing a configuration example of the structure analysis processing unit 60. The structure analysis processing unit 60 comprises a VOXEL generating unit 61, a simple reaction force computing unit 62, an analysis condition setting unit 63, an analysis executing unit 64, a total reaction force computing unit 65, a reaction force comparing unit 66 and a corrected pressure computing unit 67.

The VOXEL generating unit 61 divides the three-dimensional CAD data of analysis object input from the three-dimensional CAD system 10 into finite elements of sufficiently small VOXELs to generate a VOXEL model.

Figure 3:
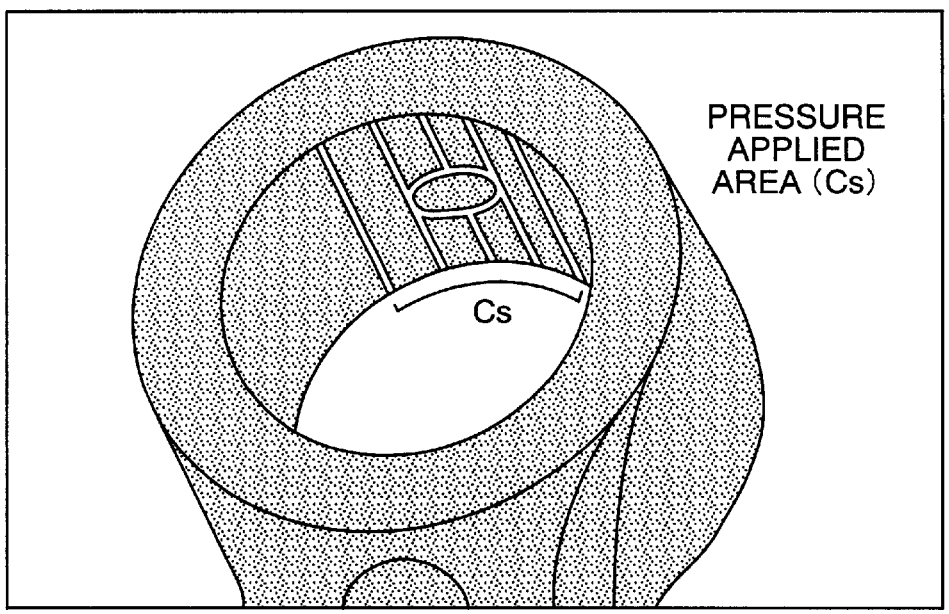
FIG. 3 is a view showing an example of the three-dimensional CAD data of an analysis object.
Figure 4:
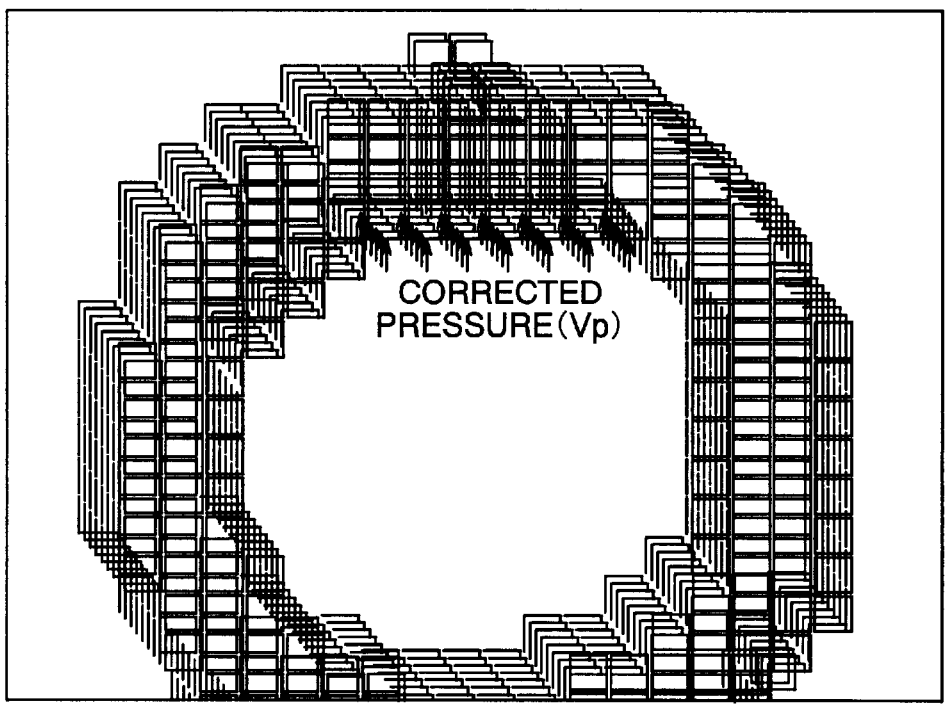
FIG. 4 is a view showing an example of a VOXEL model of the analysis object as shown in FIG. 3.

FIG. 3 shows an example of the three-dimensional CAD data of analysis object, and FIG. 4 shows an example of the VOXEL model of analysis object as shown in FIG. 3. A smooth curved surface as shown in FIG. 3 becomes an indented surface with steps as shown in FIG. 4.

The simple reaction force computing unit 62 computes a theoretically correct reaction force (reaction force A) from the pressure applied area information input from the pressure applied area information storage unit 30 and the boundary conditions input from the boundary condition storage unit 40. The reaction force A is obtained in accordance with the following expression.

Reaction force A=load=pressure applied area×applied pressure on the three-dimensional CAD data The analysis condition setting unit 63 sets up the analysis conditions from the data such as nodes (coordinates) and elements (constitutional nodes) of the VOXEL model and the boundary conditions input from the boundary condition storage unit 40. Also, the initial value of the corrected pressure is computed and set up as the pressure on the VOXEL model for the analysis conditions.

Figure 5:
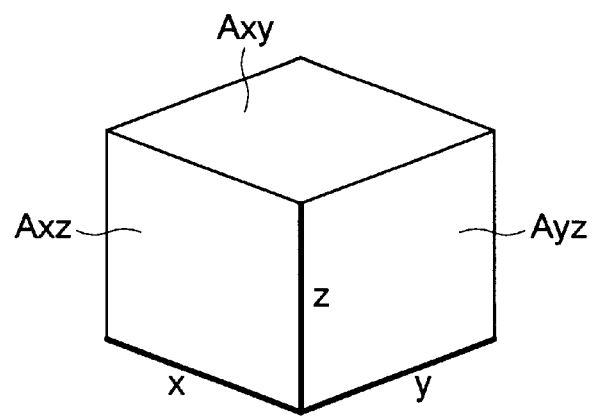
FIG. 5 is a view showing an example of one VOXEL.

Herein, the computation of the initial value of the corrected pressure will be described below. Each of the VOXELs is a rectangular parallelepiped or regular hexahedron of the same size. FIG. 5 shows an example of one VOXEL. In one VOXEL as shown in FIG. 5, it is assumed that the area of xy plane enclosed by side x and side y is $A_{xy}$, the area of xz plane enclosed by side x and side z is $A_{xz}$, and the area of yz plane enclosed by side y and side z is $A_{yz}$.

To obtain the pressure applied area of the entire VOXEL model, the pressure applied areas of VOXELs may be added. Assuming that the number of VOXELs having pressure applied on the xy plane is $N_{xy}$, the number of VOXELs having pressure applied on the xz plane is $N_{xz}$, and the number of VOXELs having pressure applied on the yz plane is $N_{yz}$, the pressure applied area $V_s$ of the entire VOXEL model is obtained in accordance with the following expression.

$$V_s=(A_{xy}\times N_{xy})+(A_{xz}\times N_{xz})+(A_{yz}\times N_{yz})$$

Figure 6:
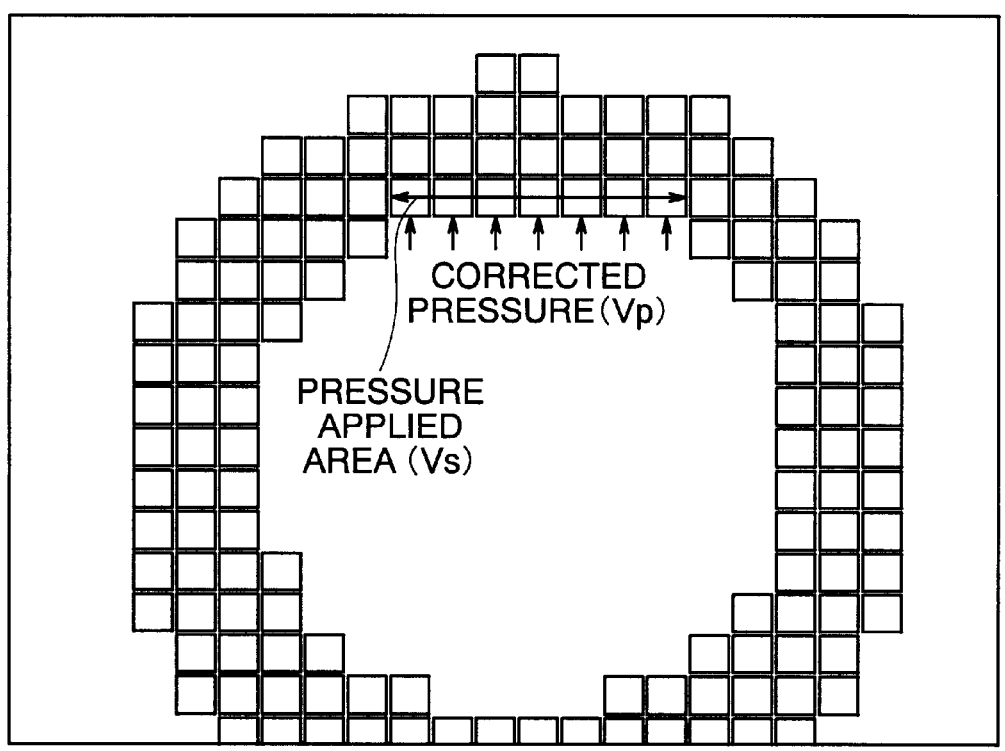
FIG. 6 is a view showing a pressure applied area of the VOXEL model as shown in FIG. 4.

FIG. 6 shows an example of the pressure applied area on the VOXEL model. In this example of FIG. 6, a pressure applied area unit of the VOXEL model of FIG. 4 is viewed from the side.

Assuming that the pressure applied on the actual analysis object is $F_p$, and the pressure applied area on the CAD that is input from the pressure applied area information storage unit 30 is $C_s$ (see FIG. 3), the initial value $V_p$ (see FIGS. 4 and 6) of corrected pressure applied on the VOXEL is obtained in accordance with the following expression, because the pressure is prounital to the area if the load is fixed.

$$F_p\times C_s=\text{load}=V_p\times V_s \rightarrow V_p=F_p\times C_s/V_s$$

The analysis executing unit 64 makes the structure analysis from the data set up by the analysis condition setting unit 63. The analysis executing unit 64 performs the structure analysis computation, using the finite element method. The structure analysis computation using the finite element method and the iteration method is well known, and is not described in detail. In addition to the stress and the displacement to be obtained, the reaction force at the point of fulcrum in the translation of x, y and z is also obtained.

The total reaction force computing unit 65 computes the reaction force (reaction force B) that is a total of reaction forces at the point of fulcrum in the translation of x, y and z that is computed on the VOXEL model.

The reaction force comparing unit 66 compares the reaction force A obtained from the simple reaction force computing unit 62 and the reaction force B obtained from the total reaction force computing unit 65 to calculate an error. Intrinsically, the reaction force A and the reaction force B should have the same value, but the reaction force B has some error due to a round-off error produced in the analysis computation or an approximation error produced in approximating the smooth curved surface by the VOXEL. If a calculated error is within the reaction force error tolerance input from the reaction force error tolerance storage unit 50, the analysis result is output.

If the calculated error is beyond the reaction force error tolerance, a corrected pressure is recorrected by the corrected pressure computing unit 67, and passed to the analysis executing unit 64 to perform the structure analysis again. Herein, the computation for recorrecting the corrected pressure is easily made from the prounital relation between the reaction force and the pressure. For example, the reaction force B is smaller by 3 percent, the corrected pressure maybe corrected by +3 percent, and if the reaction force B is greater by 5 percent, the corrected pressure may be corrected by −5 percent.

The recorrection for corrected pressure and the structure analysis are repeated until the error falls within the reaction force error tolerance.

FIG. 7 is a flowchart showing a process of the structure analysis processing unit 60. The structure analysis processing unit 60 inputs the three-dimensional CAD data of analysis object, the pressure applied area information, the boundary conditions, and the reaction force error tolerance from the three-dimensional CAD system 10, the pressure applied area information storage unit 30, the boundary condition storage unit 40 and the reaction force error tolerance storage unit 50, respectively (step S1). The VOXEL generating unit 61 generates the VOXEL model divided into finite elements from the three-dimensional CAD data of analysis object (step S2), and the simple reaction force computing unit 62 computes the reaction force A from the pressure applied area information and the boundary conditions (step S3). The analysis condition setting unit 63 sets up the boundary conditions from each data of the VOXEL model and the boundary conditions, computes the initial value of corrected pressure, and sets up the value as the corrected pressure (step S4). The structure analysis executing unit 64 executes the structure analysis from the set analysis conditions (step S5). The reaction force B is obtained from the result of structure analysis (step S6), an error between the reaction forces A and B is obtained (step S7), and it is checked whether or not the calculated error is within a range of the reaction force error tolerance (step S8). If the calculated error is outside the range of reaction force error tolerance, the corrected pressure is recorrected (step S9). The operation returns to step S5 to perform the structure analysis again. If the calculated error is within the range of reaction force error tolerance, the analysis result is output (step S10), and the process is ended.

As described above, with the present invention, unlike the prior art in which the pressure acting on the curved surface of the structure is directly applied on the approximate surface with steps of the VOXEL model, the corrected pressure is applied on the pressure application face of the VOXEL model to make the computation, whereby the structure analysis can be effected at high precision, even if the VOXEL size is not reduced more than needed. Also, the structure analysis can be made at high precision by comparing the reaction force simply obtained from the area of the structure and the pressure and the reaction force obtained from the result of analysis, recorrecting the corrected pressure in accordance with the result of analysis, reexecuting the analysis, and correcting for an error produced in the analysis computation. Furthermore, all the works except for inputting the data are automatically performed by the apparatus, whereby other persons than the analysis engineer can easily make the analysis at high precision.

What is claimed is:

1. A structure analysis processing method of making the structure analysis of a modeled analysis object to which a pressure is applied, using a VOXEL method, the method comprising:

calculating a pressure $V_p$ to be applied to a VOXEL model for the analysis object in accordance with an expression $$V_p = F_p \times C_s / V_s$$

where the pressure applied on the analysis object is $F_p$, an actual area of the analysis object to apply the pressure is $C_s$, and the area in the VOXEL model corresponding to the actual area for applying the pressure is $V_s$; and making the structure analysis using the VOXEL method with the calculated pressure $V_p$ as the pressure applied to the VOXEL model.

2. A structure analysis processing method of making the structure analysis of a modeled analysis object to which a pressure is applied, using a VOXEL method, the method comprising:

calculating a pressure to be applied to a VOXEL model of the analysis object;

calculating a structure analysis value of interest and a reaction force at a point of fulcrum by the structure analysis computation using the VOXEL method;

calculating a corrected pressure which corrects the pressure to be applied to the VOXEL model for an error between a theoretically correct reaction force corresponding to a load on the analysis object and a total of the calculated reaction forces at the points of fulcrum; and performing the structure analysis computation again, using the VOXEL method, based on the corrected pressure.

3. A structure analysis processing method of making the structure analysis of a modeled analysis object to which a pressure is applied, using a VOXEL method, the method comprising:

calculating a pressure $V_p$ to be applied to a VOXEL model for the analysis object in accordance with an expression $$V_p = F_p \times C_s / V_s$$

where the pressure $V_P$ is as an initial value of the pressure to be applied in the structure analysis computation, the pressure applied on the analysis object is $F_p$, an actual area of the analysis object to apply the pressure is $C_s$, and the area in the VOXEL model corresponding to the actual area for applying the pressure is $V_s$;

calculating a structure analysis value of interest and a reaction force at a point of fulcrum by the structure analysis computation using the VOXEL method;

calculating a corrected pressure which corrects the pressure to be applied to the VOXEL model for an error between a theoretically correct reaction force corresponding to a load on the analysis object and a total of the calculated reaction forces at the points of fulcrum; and performing the structure analysis computation again, using the VOXEL method, based on the corrected pressure.

4. A structure analysis processing program being executed on a computer to make the structure analysis of a modeled analysis object to which a pressure is applied, using a VOXEL method:

wherein the program causes the computer to execute:

calculating a pressure $V_p$ to be applied to a VOXEL model for the analysis object in accordance with an expression $$V_p = F_p \times C_s / V_s$$

where the pressure applied on the analysis object is $F_p$, an actual area of the analysis object to apply the pressure is $C_s$, and the area in the VOXEL model corresponding to the actual area for applying the pressure is $V_s$; and making the structure analysis using the VOXEL method with the calculated pressure $V_p$ as the pressure applied to the VOXEL model.

5. A structure analysis processing program being executed on a computer to make the structure analysis of a modeled analysis object to which a pressure is applied, using a VOXEL method:

wherein the program causes the computer to execute:

calculating a pressure to be applied to a VOXEL model of the analysis object;

calculating a structure analysis value of interest and a reaction force at a point of fulcrum by the structure analysis computation using the VOXEL method;

calculating a corrected pressure which corrects the pressure to be applied to the VOXEL model for an error between a theoretically correct reaction force corresponding to a load on the analysis object and a total of the calculated reaction forces at the points of fulcrum; and performing the structure analysis computation again, using the VOXEL method, based on the corrected pressure.

6. A structure analysis processing program being executed on a computer to make the structure analysis of a modeled analysis object to which a pressure is applied, using a VOXEL method:

wherein the program causes the computer to execute:

calculating a pressure $V_p$ to be applied to a VOXEL model for the analysis object in accordance with an expression $$V_p = F_p \times C_s / V_s$$

where the pressure $V_P$ is as an initial value of the pressure to be applied in the structure analysis computation, the pressure applied on the analysis object is $F_p$, an actual area of the analysis object to apply the pressure is $C_s$, and the area in the VOXEL model corresponding to the actual area for applying the pressure is $V_s$;

calculating a structure analysis value of interest and a reaction force at a point of fulcrum by the structure analysis computation using the VOXEL method;

calculating a corrected pressure which corrects the pressure to be applied to the VOXEL model for an error between a theoretically correct reaction force corresponding to a load on the analysis object and a total of the calculated reaction forces at the points of fulcrum; and performing the structure analysis computation again, using the VOXEL method, based on the corrected pressure.

7. A recording medium that records a structure analysis processing program being executed on a computer to make the structure analysis of a modeled analysis object to which a pressure is applied, using a VOXEL method:

wherein the program causes the computer to execute:

calculating a pressure $V_p$ to be applied to a VOXEL model for the analysis object in accordance with an expression $$V_p = F_p \times C_s / V_s$$

where the pressure applied on the analysis object is $F_p$, an actual area of the analysis object to apply the pressure is $C_s$, and the area in the VOXEL model corresponding to the actual area for applying the pressure is $V_s$; and making the structure analysis using the VOXEL method with the calculated pressure $V_p$ as the pressure applied to the VOXEL model.

8. A recording medium that records a structure analysis processing program being executed on a computer to make the structure analysis of a modeled analysis object to which a pressure is applied, using a VOXEL method:

wherein the program causes the computer to execute:

calculating a pressure to be applied to a VOXEL model of the analysis object;

calculating a structure analysis value of interest and a reaction force at a point of fulcrum by the structure analysis computation using the VOXEL method;

calculating a corrected pressure which corrects the pressure to be applied to the VOXEL model for an error between a theoretically correct reaction force corresponding to a load on the analysis object and a total of the calculated reaction forces at the points of fulcrum; and performing the structure analysis computation again, using the VOXEL method, based on the corrected pressure.

9. A recording medium that records a structure analysis processing program being executed on a computer to make the structure analysis of a modeled analysis object to which a pressure is applied, using a VOXEL method:

wherein the program causes the computer to execute:

calculating a pressure $V_p$ to be applied to a VOXEL model for the analysis object in accordance with an expression $$V_p = F_p \times C_s / V_s$$

where the pressure $V_p$ is as an initial value of the pressure to be applied in the structure analysis computation, the pressure applied on the analysis object is $F_p$, an actual area of the analysis object to apply the pressure is $C_s$, and the area in the VOXEL model corresponding to the actual area for applying the pressure is $V_s$;

calculating a structure analysis value of interest and a reaction force at a point of fulcrum by the structure analysis computation using the VOXEL method;

calculating a corrected pressure which corrects the pressure to be applied to the VOXEL model for an error between a theoretically correct reaction force corresponding to a load on the analysis object and a total of the calculated reaction forces at the points of fulcrum; and performing the structure analysis computation again, using the VOXEL method, based on the corrected pressure.

* * * * *